US011075248B2

(12) United States Patent
Park et al.

(10) Patent No.: US 11,075,248 B2
(45) Date of Patent: Jul. 27, 2021

(54) ORGANIC LIGHT EMITTING DISPLAY APPARATUS

(71) Applicant: LG DISPLAY CO., LTD., Seoul (KR)

(72) Inventors: MiKyung Park, Goyang-si (KR); YongCheol Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 16/440,559

(22) Filed: Jun. 13, 2019

(65) Prior Publication Data

US 2020/0035760 A1 Jan. 30, 2020

(30) Foreign Application Priority Data

Jul. 30, 2018 (KR) ........................ 10-2018-0088757

(51) Int. Cl.
*H01L 27/32* (2006.01)
*H01L 51/00* (2006.01)
*H01L 51/50* (2006.01)

(52) U.S. Cl.
CPC ...... *H01L 27/3211* (2013.01); *H01L 51/5012* (2013.01); *H01L 51/5056* (2013.01); *H01L 51/5072* (2013.01); *H01L 51/5092* (2013.01); *H01L 51/5096* (2013.01); *H01L 2251/558* (2013.01)

(58) Field of Classification Search
CPC ............. H01L 27/3206; H01L 27/3209; H01L 27/3211; H01L 27/3213; H01L 27/3216; H01L 27/3218; H01L 51/5036; H01L 51/504; H01L 51/5044
See application file for complete search history.

(56) References Cited

U.S. PATENT DOCUMENTS

2009/0051275 A1\* 2/2009 Kobayashi .......... H01L 51/5265
 313/504
2016/0293675 A1\* 10/2016 Kim .................... H01L 27/3211

FOREIGN PATENT DOCUMENTS

KR 10-2014-0140413 A 12/2014

\* cited by examiner

*Primary Examiner* — Sue A Purvis
*Assistant Examiner* — Scott Stowe
(74) *Attorney, Agent, or Firm* — Birch, Stewart, Kolasch & Birch, LLP (57) ABSTRACT

An organic light emitting display apparatus includes a first electrode on a substrate and a plurality of organic layers on the first electrode and including a first region and a second region. The organic light emitting display apparatus further includes a second electrode on the plurality of organic layers. A thickness of the plurality of organic layers in the first region can be different from a thickness of the plurality of organic layers in the second region.

19 Claims, 6 Drawing Sheets

ORGANIC LIGHT EMITTING DISPLAY APPARATUS

CROSS-REFERENCE TO RELATED APPLICATIONS

This application claims the priority of Korean Patent Application No. 10-2018-0088757 filed on Jul. 30, 2018, in the Korean Intellectual Property Office, the disclosure of which is incorporated herein by reference into the present application.

BACKGROUND

Field

The present disclosure relates to an organic light emitting display apparatus and more particularly, to an organic light emitting display apparatus which can improve the light efficiency and secure a color viewing angle.

Description of the Related Art

As the information age advances, the field of a display apparatus for visually displaying electrical information signals has grown rapidly. Accordingly, various studies on display apparatuses are ongoing to improve the performance such as thinning, weight lightening, and low power consumption.

Among various display apparatuses, an organic light emitting display apparatus is a self-light emitting display apparatus and does not need a separate light source unlike a liquid crystal display apparatus. Thus, the organic light emitting display apparatus can be manufactured into a lightweight and thin form. Further, the organic light emitting display apparatus is advantageous in terms of power consumption since it is driven with a low voltage. Also, the organic light emitting display apparatus has excellent color expression ability, a high response speed, a wide viewing angle, and a high contrast ratio (CR). Therefore, the organic light emitting display apparatus is expected to be applied to various fields.

SUMMARY

A top-emission organic light emitting display apparatus uses a light-transmissive material for a cathode to release light emitted from an organic light-emission layer to a top side of the organic light emitting display apparatus. Although the cathode is light-transmissive, a part of the light emitted from the organic light-emission layer is reflected from the cathode toward an anode and reflected again from the anode. Thus, light is repeatedly reflected between the anode and the cathode.

Therefore, the inventors of the present disclosure designed an organic light emitting apparatus of an organic light emitting display apparatus to implement a micro-cavity. The micro-cavity allows light to be repeatedly reflected between two layers spaced from each other by an optical length, and, thus, the light having a specific wavelength is amplified through constructive interference. Thus, the inventors of the present disclosure have invented an organic light emitting display apparatus with improved light efficiency.

On the other hand, if the micro-cavity is implemented to improve the light efficiency, a front brightness is increased, and, thus, the light efficiency of a front surface is improved. However, a lateral brightness may be decreased due to a viewing angle characteristic which is in inverse proportion to a front view characteristic. Thus the inventors of the present disclosure have recognized that it is disadvantageous in terms of color viewing angle. For example, the inventors of the present disclosure have found that there is a trade-off relationship between the micro-cavity and the color viewing angle. Thus, the inventors of the present disclosure recognized that there was a need to implement the micro-cavity by adjusting the thickness of organic layers between the cathode and the anode and also to improve a viewing angle through the cathode or other components, e.g., an encapsulation layer, on the cathode. The color viewing angle can be represented as a color coordinate variation ($\Delta'v'$). The color coordinate variation ($\Delta'v'$) refers to a difference between a color coordinate at 0° when the organic light emitting display apparatus is viewed from the front and a color coordinate at a viewing angle of 60°. The color coordinate (u'v') can be a 1976 uniform chromaticity scale diagram (UCS) coordinate defined by the International Commission on Illumination (CIE) 15.2.

Accordingly, the inventors of the present disclosure have invented an organic light emitting display apparatus having a new and improved structure. In this structure, two regions with different thicknesses are formed within an organic layer of the organic light emitting display apparatus without adding or changing a component. Thus, the light efficiency can be improved and a satisfying color viewing angle can be secured.

Accordingly, an object to be achieved by the present disclosure is to provide an organic light emitting display apparatus including two regions with different thicknesses within an organic layer for each sub-pixel.

Further, another object to be achieved by the present disclosure is to provide an organic light emitting display apparatus which can improve the light efficiency and color viewing angle of an organic light emitting device.

Another object of the present disclosure is to provide an improved organic light emitting display apparatus which addresses the limitations and disadvantages associated with organic light emitting display apparatuses of the background art.

Objects of the present disclosure are not limited to the above-mentioned objects, and other objects, which are not mentioned above, can be clearly understood by those skilled in the art from the following descriptions.

According to an aspect of the present disclosure, an organic light emitting display apparatus includes a first electrode on a substrate and a plurality of organic layers on the first electrode and including a first region and a second region. The organic light emitting display apparatus includes a second electrode on the plurality of organic layers. A thickness of the plurality of organic layers in the first region can be different from a thickness of the plurality of organic layers in the second region. Therefore, it is possible to improve the light efficiency and color viewing angle just by adjusting the thickness of the organic layers of the organic light emitting display apparatus.

According to another aspect of the present disclosure, an organic light emitting display apparatus includes a substrate including a plurality of sub-pixels and a plurality of first electrodes in the plurality of sub-pixels, respectively. The organic light emitting display apparatus includes a plurality of organic layers on each of the plurality of first electrodes and a second electrode on the plurality of organic layers in each of the plurality of sub-pixels. Each of the plurality of sub-pixels includes a light efficiency enhancement region and a viewing angle enhancement region in which the plurality of organic layers have different thicknesses. Therefore, it is possible to secure the light efficiency and color viewing angle having a trade-off relationship with each other in the organic light emitting display apparatus without an additional process.

According to another aspect of the present disclosure, an organic light emitting display apparatus includes a plurality of sub-pixels on a substrate, including a red sub-pixel, a green sub-pixel, and a blue sub-pixel. Each of the red, green and blue sub-pixels includes a first electrode on the substrate, a plurality of organic layers on each of the plurality of first electrodes and including a first region and a second region, a second electrode on the plurality of organic layers. For each of the red, green and blue sub-pixels, a thickness of the plurality of organic layers in the first region is greater than a thickness of the plurality of organic layers in the second region.

Other detailed matters of the exemplary embodiments are included in the detailed description and the drawings.

According to the present disclosure, a first region and a second region each including a plurality of organic layers with different thicknesses are formed in each sub-pixel. Thus, it is possible to obtain a region where a micro-cavity can be implemented and a region where a color viewing angle can be improved.

According to the present disclosure, it is possible to improve the light efficiency and color viewing angle without additional processes or costs by changing the shape of a mask when forming a plurality of organic layers of an organic light emitting display apparatus.

The effects and advantages according to the present disclosure are not limited to the contents exemplified above and below, and other various effects and advantages are included in the present specification and are provided by the light emitting display apparatuses of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "include," and "have," used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings.

Figure 1:
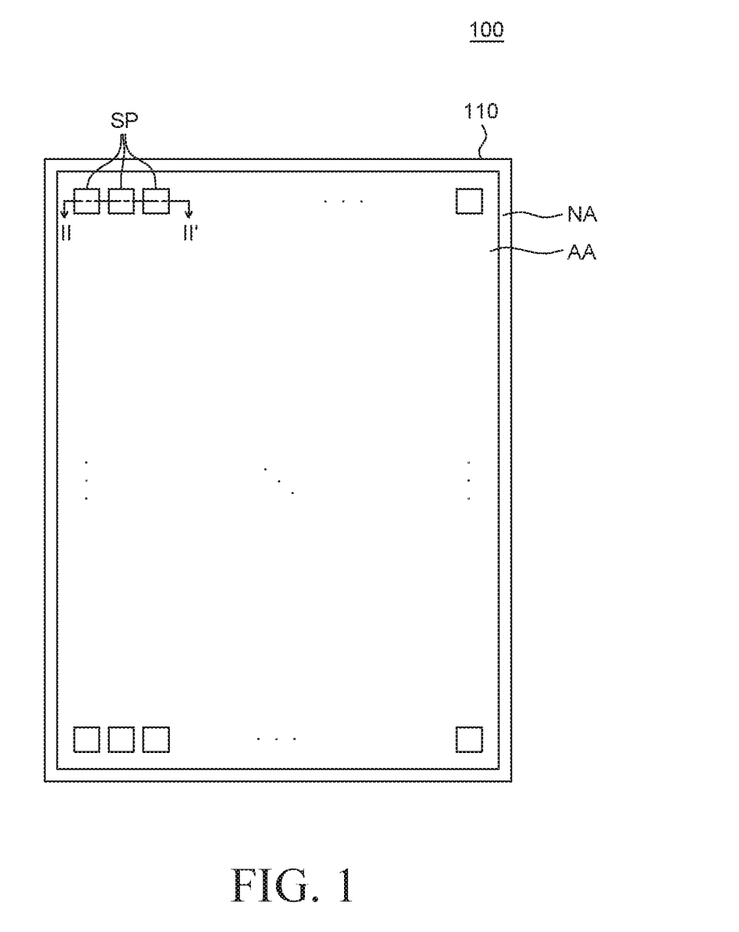
FIG. 1 is a plan view of an organic light emitting display apparatus according to an embodiment of the present disclosure.

FIG. 1 is a plan view of an organic light emitting display apparatus according to an embodiment of the present disclosure. The components of the organic light emitting display apparatus according to all embodiments of the present disclosure are operatively coupled and configured. For convenience of description, FIG. 1 illustrates only a substrate 110 and a plurality sub-pixels SP among various components of an organic light emitting display apparatus 100.

Referring to FIG. 1, the substrate 110 serves to support and protect various components of the organic light emitting display apparatus 100. The substrate 110 can be formed of glass, or a plastic material having flexibility. If the substrate 110 is formed of a plastic material, it can be formed of, e.g., polyimide (PI), but is not limited thereto and other variations are possible.

The substrate 110 of the organic light emitting display apparatus 100 includes an active area AA and a non-active area NA.

The active area AA is a region of the organic light emitting display apparatus 100 in which images are displayed. In the active area AA, a display device and various driving devices for driving the display device can be disposed. For example, the display device can be configured as an organic light emitting device including a first electrode, an organic layer, and a second electrode. Further, various driving devices, such as a transistor for driving the display device, a capacitor, and a line, can be disposed in the active area AA. Details of the active area AA will be described later with reference to FIG. 2 and FIG. 3.

The active area AA can include the plurality of sub-pixels SP. Each sub-pixel SP is a minimum unit for displaying an image. Each sub-pixel SP can include the organic light emitting device and a drive circuit for driving the corresponding organic light emitting device. Further, the plurality of sub-pixels SP can emit light with different wavelengths. For example, the plurality of sub-pixels SP can include a red sub-pixel, a green sub-pixel, and a blue sub-pixel, but is not limited thereto and other variations are possible. The plurality of sub-pixels SP can further include a white sub-pixel or other combinations of color sub-pixels.

The drive circuit of each sub-pixel SP is configured to control driving of the organic light emitting device. For example, the drive circuit can include a transistor and a capacitor, but is not limited thereto and other variations are possible.

The non-active area NA is a region of the organic light emitting display apparatus 100 in which images are not displayed. In the non-active area NA, various components for driving the plurality of sub-pixels SP disposed in the active area AA can be disposed. For example, a drive IC configured to supply a signal for driving the plurality of sub-pixels SP, a flexible film, etc. can be disposed in the non-active area NA.

The non-active area NA can be a region surrounding the active area AA as shown in FIG. 1, but is not limited thereto and other variations are possible. For example, the non-active area NA can be a region extended from the active area AA and can be bent or includes one or more bends.

Hereafter, the plurality of sub-pixels SP disposed in the active area AA of the organic light emitting display apparatus 100 will be described in detail with reference to FIG. 2 through FIG. 4.

Figure 2:
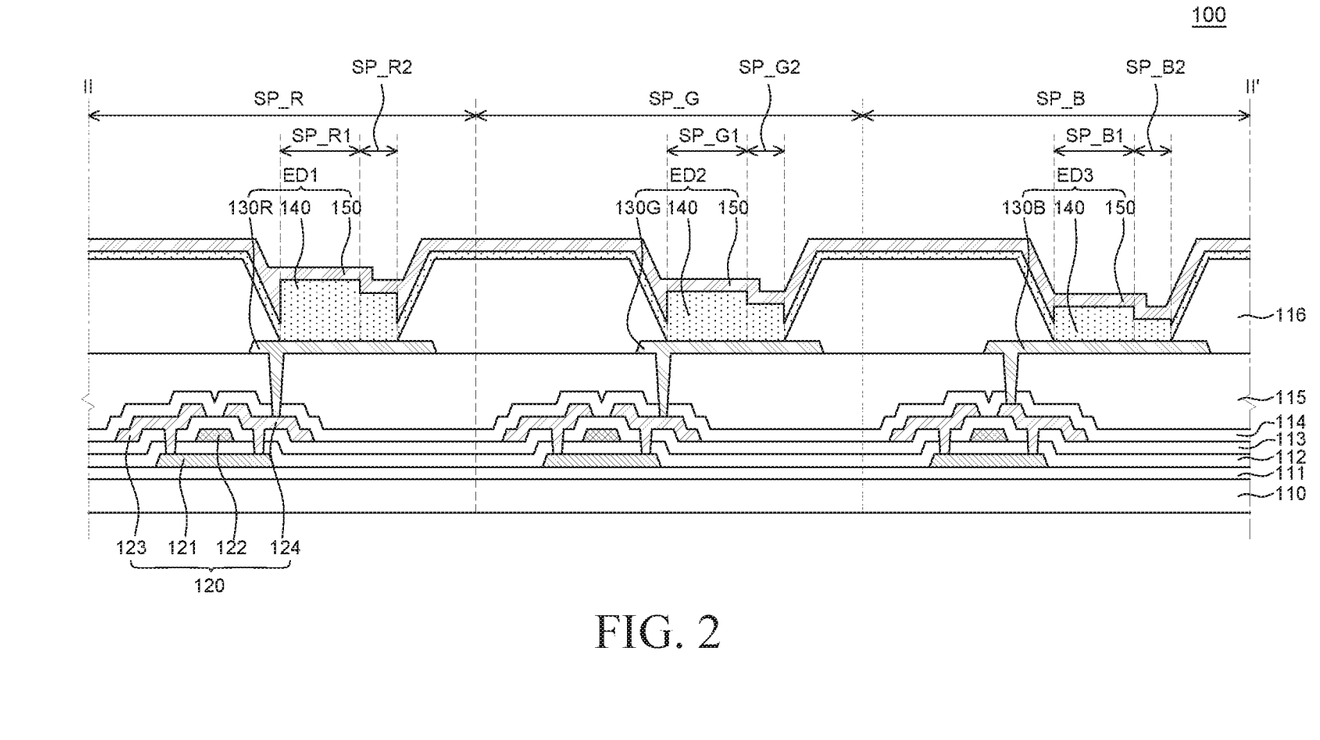
FIG. 2 is a cross-sectional view of the organic light emitting display apparatus shown in FIG. 1 as taken along a line II-II'.

FIG. 2 is a cross-sectional view of the organic light emitting display apparatus shown in FIG. 1 as taken along a line II-II'. FIG. 3 is a cross-sectional view of a plurality of organic layers of the organic light emitting display apparatus of FIG. 2 according to an embodiment of the present disclosure. FIG. 4 illustrates a process for forming the plurality of organic layers of the organic light emitting display apparatus of FIG. 3 according to an embodiment of the present disclosure. FIG. 2 to FIG. 4 illustrate only a red sub-pixel SP_R, a green sub-pixel SP_G, and a blue sub-pixel SP_B among the plurality of sub-pixels SP. Further, for convenience of description, FIG. 3 and FIG. 4 illustrate that organic light-emission layers 143R, 143G, and 143B adjoin each other and anodes 130R, 130G, and 130B adjoin each other. However, actually, the organic light-emission layers 143R, 143G, and 143B can be spaced from each other and the anodes 130R, 130G, and 130B can be spaced from each other.

With reference to FIG. 2, the organic light emitting display apparatus 100 according to an embodiment of the present disclosure includes the substrate 110, a buffer layer 111, and a gate insulating layer 112. The organic light emitting display apparatus 100 further includes an interlayer insulating layer 113, a thin film transistor 120, a passivation layer 114, an overcoating layer 115, a bank 116, and organic light emitting devices ED1, ED2, and ED3.

With reference to FIG. 2, the buffer layer 111 is disposed on the substrate 110. The buffer layer 111 functions to enhance adhesion between the substrate 110 and layers formed on the buffer layer 111 and to block alkali elements discharged from the substrate 110. The buffer layer 111 can be formed of a single layer of silicon nitride (SiNx) or silicon oxide (SiOx) or a multilayer of silicon nitride (SiNx) and silicon oxide (SiOx). However, the buffer layer 111 is not an essential component, but may be omitted depending on the kind and material of the substrate 110 and a structure and type of the thin film transistor 120.

The thin film transistor 120 is disposed on the buffer layer 111 to drive the organic light emitting devices ED1, ED2, and ED3 in the active area AA. Each thin film transistor 120 drives the corresponding light emitting device, e.g., ED1, ED2 or ED3. The thin film transistor 120 includes an active layer 121, a gate electrode 122, a source electrode 123, and a drain electrode 124. The thin film transistor 120 illustrated in FIG. 2 is a drive transistor configured as a top-gate thin film transistor in which the gate electrode 122 is disposed on the active layer 121, but is not limited thereto and other variations are possible. The thin film transistor 120 can also be implemented as a bottom-gate thin film transistor.

An active layer 121 of the thin film transistor 120 is disposed on the buffer layer 111. When the thin film transistor 120 is driven, a channel is formed in the active layer 121. The active layer 121 can be formed of an oxide semiconductor, amorphous silicon (a-Si), polycrystalline silicon (poly-Si), or an organic semiconductor, etc.

A gate insulating layer 112 is disposed on the active layer 121. The gate insulating layer 112 can be formed of a single layer of an inorganic material such as silicon nitride (SiNx) or silicon oxide (SiOx) or a multilayer of silicon nitride (SiNx) or silicon oxide (SiOx). In the gate insulating layer 112, contact holes through which the source electrode 123 and the drain electrode 124 are in contact with a source region and a drain region, respectively, of the active layer 121 are formed. The gate insulating layer 112 can be formed on the entire surface of the substrate 110 as illustrated in FIG. 2, or patterned to have the same width as the gate electrode 122, but is not limited thereto and other variations are possible.

A gate electrode 122 is disposed on the gate insulating layer 112. The gate electrode 122 is disposed on the gate insulating layer 112 to overlap a channel region of the active layer 121. The gate electrode 122 can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

An interlayer insulating layer 113 is disposed on the gate electrode 122. The interlayer insulating layer 113 can be formed of a single layer of an inorganic material such as silicon nitride (SiNx) or silicon oxide (SiOx) or a multilayer of silicon nitride (SiNx) or silicon oxide (SiOx). In the interlayer insulating layer 113, contact holes through which the source electrode 123 and the drain electrode 124 are in contact with the source region and the drain region, respectively, of the active layer 121 are formed.

The source electrode 123 and the drain electrode 124 are disposed on the interlayer insulating layer 113. The source electrode 123 and the drain electrode 124 are electrically connected to the active layer 121 through the contact holes in the gate insulating layer 112 and the interlayer insulating layer 113. The source electrode 123 and the drain electrode 124 can be formed of any one of various metal materials such as molybdenum (Mo), aluminum (Al), chromium (Cr), gold (Au), titanium (Ti), nickel (Ni), neodymium (Nd), and copper (Cu) or an alloy of two or more of them, or a multilayer thereof.

For convenience of description, FIG. 2 illustrates only the drive transistor among various thin film transistors 120 included in the organic light emitting display apparatus 100. However, other transistors such as a switching transistor, etc. can be disposed.

With reference to FIG. 2, the passivation layer 114 configured to protect the thin film transistor 120 is disposed on the thin film transistor 120. In the passivation layer 114, a contact hole that exposes the drain electrode 124 of the thin film transistor 120 is formed. Although FIG. 2 illustrates that the contact hole that exposes the drain electrode 124 is formed in the passivation layer 114, a contact hole that exposes the source electrode 123 can be formed. The passivation layer 114 can be formed of a single layer of silicon nitride (SiNx) or silicon oxide (SiOx) or a multilayer of silicon nitride (SiNx) or silicon oxide (SiOx) However, the passivation layer 114 may be omitted in some embodiments.

With reference to FIG. 2, the overcoating layer 115 configured to planarize an upper portion of the thin film transistor 120 is disposed. In the overcoating layer 115, a contact hole that exposes the drain electrode 124 of the thin film transistor 120 is formed. Although FIG. 2 illustrates that the contact hole that exposes the drain electrode 124 is formed in the overcoating layer 115, a contact hole that exposes the source electrode 123 can be formed. The overcoating layer 115 can be formed of any one of acrylic resin, epoxy resin, phenol resin, polyamide-based resin, polyimide-based resin, unsaturated polyester-based resin, polyphenylene-based resin, poly(phenylenesulfide)-based resin, benzocyclobutene, and photoresist.

The organic light emitting devices ED1, ED2, and ED3 are disposed on the overcoating layer 115. The organic light emitting devices ED1, ED2, and ED3 include a first organic light emitting device ED1 in a red sub-pixel SP_R, a second organic light emitting device ED2 in a green sub-pixel SP_G, and a third organic light emitting device ED3 in a blue sub-pixel SP_B.

The organic light emitting devices ED1, ED2, and ED3 include first electrodes 130R, 130G, and 130B electrically connected to the drain electrode 124. The organic light emitting devices ED1, ED2, and ED3 include a plurality of organic layers 140 on the first electrodes 130R, 130G, and 130B, and second electrodes 150 on the plurality of organic layers 140, respectively. For example, the first organic light emitting device ED1 in the red sub-pixel SP_R includes a first electrode 130R, a plurality of organic layers 140, and a second electrode 150. The second organic light emitting device ED2 in the green sub-pixel SP_G includes a first electrode 130G, a plurality of organic layers 140, and a second electrode 150. The third organic light emitting device ED3 in the blue sub-pixel SP_B includes a first electrode 130B, a plurality of organic layers 140, and a second electrode 150. Here, the plurality of organic layer 140 can constitute layers 141-145 shown in FIG. 3 which will be described later in more detail.

Figure 3:
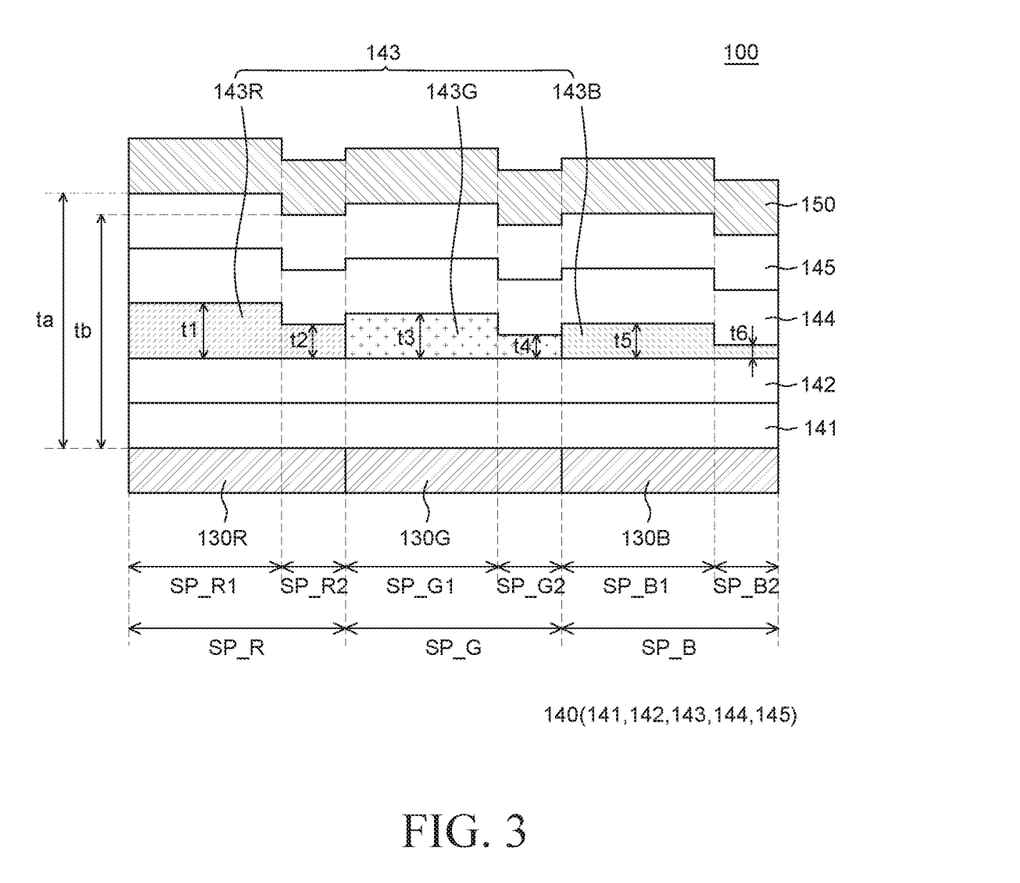
FIG. 3 is a cross-sectional view of a plurality of organic layers of the organic light emitting display apparatus of FIG. 2 according to an embodiment of the present disclosure.

With reference to FIG. 2 and FIG. 3, the first electrodes 130R, 130G, and 130B are disposed on the overcoating layer 115 and connected respectively to the drain electrodes 124 through the contact holes in the overcoating layer 115. The first electrodes 130R, 130G, and 130B can be anodes formed of a conductive material having a high work function to supply holes into the organic light-emission layers 143, respectively. The first electrodes 130R, 130G, and 130B can be formed of a transparent conductive material such as indium-tin-oxide (ITO), indium-zinc-oxide (IZO), or the like, but are not limited thereto and other variations are possible.

Further, the organic light emitting display apparatus 100 according to an embodiment of the present disclosure is top-emission type. Thus, light emitted from the plurality of organic layers 140 is released to a top portion of the organic light emitting display apparatus 100 through the second electrode 150. Therefore, the organic light emitting display apparatus 100 can further include reflective layers under the first electrodes 130R, 130G, and 130B, respectively, and formed of a metal material, but is not limited thereto and other variations are possible. For example, each of the first electrodes 130R, 130G, and 130B can have a structure in which a layer formed of a transparent conductive material and a reflective layer are laminated.

FIG. 2 illustrates that the first electrodes 130R, 130G, and 130B are electrically connected to the drain electrodes 124 of the thin film transistors 120 through the contact holes, respectively. However, the first electrodes 130R, 130G, and 130B can be electrically connected to the source electrodes 123 of the thin film transistors 120 through the contact holes, respectively, according to the type of the thin film transistors 120 and the design method of the drive circuits, etc.

With reference to FIG. 2, the banks 116 are disposed on the first electrodes 130R, 130G, and 130B and the overcoating layer 115. The banks 116 can cover some portions of the first electrodes 130R, 130G, and 130B of the organic light emitting devices ED1, ED2, and ED3 and define emission zones, respectively. The banks 116 can be formed of on polyimide, acryl, or benzocyclobutene (BCB)-based resin, but are not limited thereto and other variations are possible.

With reference to FIG. 2 and FIG. 3, the second electrode 150 is disposed on the plurality of organic layers 140. The second electrode 150 can be a cathode that supplies electrons into the plurality of organic layers 140. The second electrode 150 can be formed of a conductive material having a low work function and can be formed of a metal material. For example, the second electrode 150 can be formed of any one or more of metals such as magnesium (Mg), silver (Ag), aluminum (Al), and calcium (Ca), and alloys thereof, but is not limited thereto and other variations are possible. For example, the second electrode 150 can be formed of a transparent conductive material or a material such as ytterbium (Yb).

Each of the organic light emitting devices ED1, ED2, and ED3 can include at least two regions with different thicknesses. For example, the plurality of organic layers 140 in each of the sub-pixels SP can include a first region SP_R1, SP_G1, or SP_B1 and a second region SP_R2, SP_G2, or SP_B2 with different thicknesses between the first electrode 130R, 130G, or 130B and the second electrode 150, respectively.

The plurality of organic layers 140 include an organic layer configured to emit light of a specific color. For example, the plurality of organic layers 140 can include an organic layer configured to emit red light, green light, or blue light, or other color as designed.

For example, with reference to FIG. 3, the plurality of organic layers 140 includes a hole injection layer 141, a hole transport layer 142, an organic light-emission layer 143, an electron transport layer 144, and an electron injection layer 145. However, the present disclosure is not limited thereto and other variations are possible. For example, one or more layers of the hole injection layer 141, the hole transport layer 142, the electron transport layer 144, and the electron injection layer 145 can be omitted. Otherwise, the plurality of organic layers 140 can further include various layers such as a hole blocking layer and an electron blocking layer, etc.

With reference to FIG. 3, the hole injection layer 141 is disposed on the first electrode 130R in the red sub-pixel SP_R, on the first electrode 130G in the green sub-pixel SP_G, and on the first electrode 130B in the blue sub-pixel SP_B. The hole injection layer 141 is an organic layer that functions to enable a smooth injection of holes from the first electrodes 130R, 130G, and 130B into the organic light-emission layer 143. For example, the hole injection layer 141 can be formed of a material having any one or more of HAT-CN(dipyrazino[2,3-f:2',3'-h]quinoxaline-2,3,6,7,10, 11-hexacarbonitrile), CuPc(phthalocyanine), F4-TCNQ(2,3, 5,6-tetrafluoro-7,7,8,8-tetracyano-quinodimethane), and NPD(N,N'-bis(naphthalene-1-yl)-N,N'-bis(phenyl)-2,2'-dimethylbenzidine). However, the present disclosure is not limited thereto and other variations are possible.

With reference to FIG. 3, the hole transport layer 142 is disposed on the hole injection layer 141. The hole transport layer 142 is an organic layer that enables the smooth transport of holes from the hole injection layer 141 to the organic light-emission layer 143. For example, the hole transport layer 142 can be formed of a material having any one or more of NPD(N,N'-bis(naphthalene-1-yl)-N,N'-bis (phenyl)-2,2'-dimethylbenzidine), TPD(N,N'-bis-(3-methylphenyl)-N,N'-bis(phenyl)-benzidine), s-TAD(2,2',7,7'-tetrakis(N,N-dimethylamino)-9,9-spirofluorene) and MTDATA(4,4',4"-Tris(N-3-methylphenyl-N-phenyl-amino)-triphenylamine). However, the present disclosure is not limited thereto and other variations are possible.

The organic light-emission layer 143 is disposed on the hole transport layer 142. In the organic light-emission layer 143, holes supplied from the first electrodes 130R, 130G, and 130B and electrons supplied from the second electrode 150 recombine into excitons. Further, a region where the excitons are generated can be an emission zone or recombination zone.

The organic light-emission layer 143 is disposed between the hole transport layer 142 and the electron transport layer 144 and can have a material capable of emitting light of a specific color.

Further, the organic light-emission layer 143 can include a first organic light-emission layer 143R, a second organic light-emission layer 143G, and a third organic light-emission layer 143B. The first organic light-emission layer 143R, the second organic light-emission layer 143G, and the third organic light-emission layer 143B have materials capable of emitting red light, green light, and blue light, respectively.

With reference to FIG. 3, the electron transport layer 144 is disposed on the organic light-emission layer 143. The electron transport layer 144 can suppress or prevent the leakage of holes that cannot participate in the recombination from the organic light-emission layer 143. Otherwise, the electron transport layer 144 can transport electrons from the second electrode 150 to the organic light-emission layer 143. For example, the electron transport layer 144 can be formed of a material having any one or more of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline) and BAlq(bis(2-methyl-8-quinolinolate)-4-(phenylphenolato)aluminium). However, the present disclosure is not limited thereto and other variations are possible.

The electron injection layer 145 is disposed on the electron transport layer 144. The electron injection layer 145 is a layer that enables the smooth injection of electrons from the second electrode 150 into the organic light-emission layer 143. For example, the electron injection layer 145 can be formed of a material having any one or more of alkali metals such as LiF, BaF2, and CsF or alkali earth metals, but is not limited thereto and other variations are possible.

The organic light-emission layer 143 can be formed by patterning for each sub-pixel SP. Each of the hole injection layer 141, the hole transport layer 142, the electron transport layer 144, and the electron injection layer 145 can be a common layer formed as a single layer for the plurality of sub-pixels SP.

Herein, referring specifically to FIG. 3, the plurality of organic layers 140 include two regions with different thicknesses in each sub-pixel SP. For example, the plurality of organic layers 140 in each sub-pixel SP can include the first region SP_R1, SP_G1, or SP_B1 and the second region SP_R2, SP_G2, or SP_B2 with different thicknesses.

The plurality of organic layers 140 can have different thicknesses in the first region SP_R1 and the second region SP_R2 of the red sub-pixel SP_R. For example, a thickness ta in the first region SP_R1 can be greater than a thickness tb in the second region SP_R2. As such, the first organic light-emission layer 143R in the red sub-pixel SP_R can have different thicknesses in the first region SP_R1 and the second region SP_R2 such that the thickness ta in the first region SP_R1 is greater than the thickness tb in the second region SP_R2. For example, as illustrated in FIG. 3, a thickness t1 of the first organic light-emission layer 143R in the first region SP_R1 can be greater than a thickness t2 of the first organic light-emission layer 143R in the second region SP_R2.

As described above, the plurality of organic layers 140 has different thicknesses in the first region SP_R1 and the second region SP_R2 of the red sub-pixel SP_R. Thus, the first region SP_R1 can be a light efficiency enhancement region and the second region SP_R2 can be a viewing angle enhancement region. For example, the thickness ta of the plurality of organic layers 140 in the first region SP_R1 can be determined by the following Equation 1.

$$ta = m\lambda/2n \qquad \text{[Equation 1]}$$

In the above, ta=thickness of the plurality of organic layers 140 in the first region SP_R1, m=positive integer, n=refractive index of the plurality of organic layers 140, λ=wavelength of light emitted from the first organic light-emission layer 143R among the plurality of organic layers 140. Here, ta is the total thickness of the plurality of organic layers 140 in the first region SP_R1. Further, this equation can be used to correspond with all other regions such as SP_R2, SP_G1, etc.

Thus, the first region SP_R1 of the red sub-pixel SP_R can be a light efficiency enhancement region where the light efficiency can be improved by constructive interference of light emitted from the first organic light-emission layer 143R.

Further, the thickness tb (i.e., the total thickness) of the plurality of organic layers 140 in the second region SP_R2 can be smaller than the thickness ta of the plurality of organic layers 140 in the first region SP_R1. Thus, a micro-cavity is not implemented in the second region SP_R2, or even if it is implemented, the micro-cavity has a lower intensity in the second region SP_R2 than in the first region SP_R1. Therefore, the second region SP_R2 can be a viewing angle enhancement region where a decrease in color viewing angle occurring when a stronger micro-cavity is implemented in the first region SP_R1 of the red sub-pixel SP_R can be compensated.

Similarly, the plurality of organic layers 140 can have different thicknesses (i.e., the total thicknesses) in the first region SP_G1 and the second region SP_G2 of the green sub-pixel SP_G. For example, the thickness in the first region SP_G1 can be greater than the thickness in the second region SP_G2. As such, the second organic light-emission layer 143G in the green sub-pixel SP_G can have different thicknesses in the first region SP_G1 and the second region SP_G2 such that the thickness in the first region SP_G1 is greater than the thickness in the second region SP_G2. For example, as illustrated in FIG. 3, a thickness t3 of the second organic light-emission layer 143G in the first region SP_G1 can be greater than a thickness t4 of the second organic light-emission layer 143G in the second region SP_G2.

As described above, the plurality of organic layers 140 has different thicknesses in the first region SP_G1 and the second region SP_G2 of the green sub-pixel SP_G. Thus, the first region SP_G1 can be a light efficiency enhancement region and the second region SP_G2 can be a viewing angle enhancement region. Further, the thickness of the plurality of organic layers 140 in the first region SP_G1 can be determined or adjusted by the above Equation 1. Thus, the first region SP_G1 of the green sub-pixel SP_G can be a light efficiency enhancement region where the light efficiency can be improved by constructive interference of light emitted from the second organic light-emission layer 143G.

Further, the thickness of the plurality of organic layers 140 in the second region SP_G2 can be smaller than the thickness of the plurality of organic layers 140 in the first region SP_G1. Thus, a micro-cavity is not implemented in the second region SP_G2 or, even if it is implemented, the micro-cavity has a lower intensity in the second region SP_G2 than in the first region SP_G1. Therefore, the second region SP_G2 can be a viewing angle enhancement region where a decrease in color viewing angle occurring when a stronger micro-cavity is implemented in the first region SP_G1 of the green sub-pixel SP_G can be compensated.

Furthermore, the plurality of organic layers 140 can have different thicknesses (i.e., the total thicknesses) in the first region SP_B1 and the second region SP_B2 of the blue sub-pixel SP_B. For example, the thickness in the first region SP_B1 can be greater than the thickness in the second region SP_B2. As such, the third organic light-emission layer 143B in the blue sub-pixel SP_B can have different thicknesses in the first region SP_B1 and the second region SP_B2 such that the thickness in the first region SP_B1 is greater than the thickness in the second region SP_B2. For example, as illustrated in FIG. 3, a thickness t5 of the third organic light-emission layer 143B in the first region SP_B1 can be greater than a thickness t6 of the third organic light-emission layer 143B in the second region SP_B2.

As described above, the plurality of organic layers 140 has different thicknesses in the first region SP_B1 and the second region SP_B2 of the blue sub-pixel SP_B. Thus, the first region SP_B1 can be a light efficiency enhancement region and the second region SP_B2 can be a viewing angle enhancement region. Further, the thickness of the plurality of organic layers 140 in the first region SP_B1 can be determined or adjusted by the above Equation 1. Thus, the first region SP_B1 of the blue sub-pixel SP_B can be a light efficiency enhancement region where the light efficiency can be improved by constructive interference of light emitted from the third organic light-emission layer 143B.

Further, the thickness of the plurality of organic layers 140 in the second region SP_B2 can be smaller than the thickness of the plurality of organic layers 140 in the first region SP_B1. Thus, a micro-cavity is not implemented in the second region SP_B2, or even if it is implemented, the micro-cavity has a lower intensity in the second region SP_B2 than in the first region SP_B1. Therefore, the second region SP_B2 can be a viewing angle enhancement region where a decrease in color viewing angle occurring when a stronger micro-cavity is implemented in the first region SP_B1 of the blue sub-pixel SP_B can be compensated.

Furthermore, the thickness t1 can be greater than the thickness t3 which can be greater than the thickness t5. Also the thickness t2 can be greater than the thickness t4 which can be greater than the thickness t6.

Figure 4:
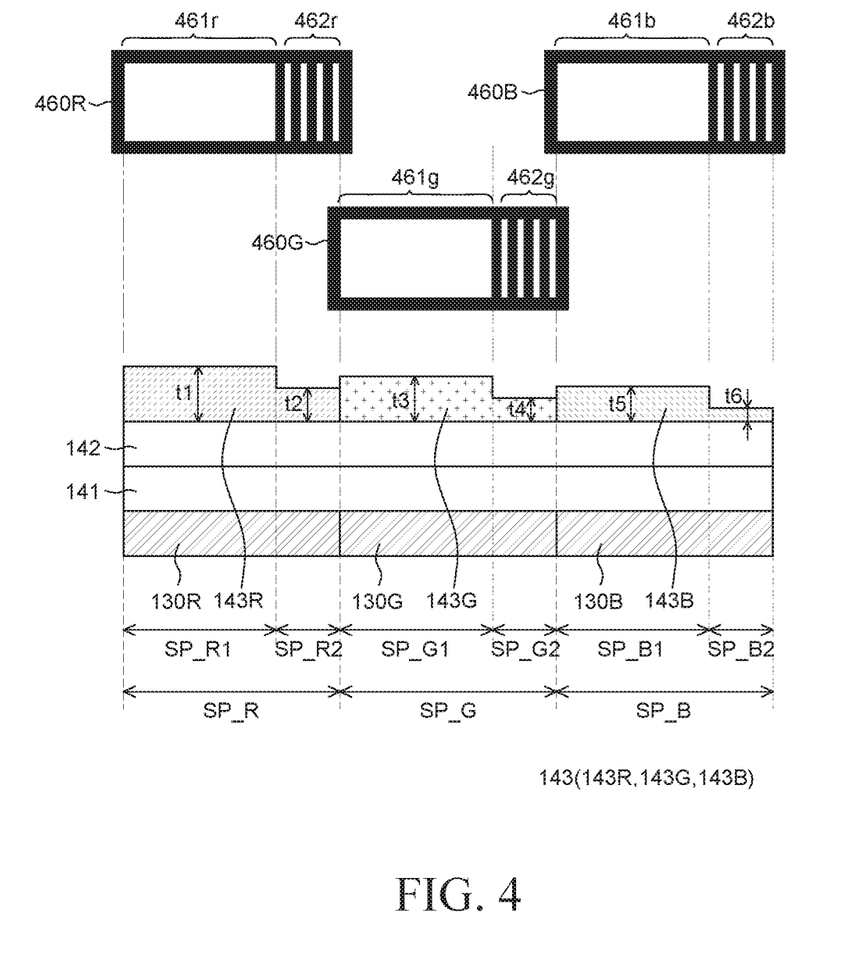
FIG. 4 illustrates a process for forming the plurality of organic layers of the organic light emitting display apparatus of FIG. 3 according to an embodiment of the present disclosure.

FIG. 3 and FIG. 4 illustrate that the organic light-emission layer 143 has vertical steps at the boundaries between the first regions SP_R1, SP_G1, and SP_B1 and the second regions SP_R2, SP_G2, and SP_B2, or any boundary between these regions. However, the present disclosure is not limited thereto and other variations are possible. For example, the organic light-emission layer 143 can have slanted steps at the boundaries between the first regions SP_R1, SP_G1, and SP_B1 and the second regions SP_R2, SP_G2, and SP_B2, or any boundary between these regions.

The process of forming the organic light-emission layer 143 for forming the above-described plurality of organic layers 140 will be described in more detail with reference to FIG. 4.

Referring to FIG. 4, the organic light-emission layer 143 can be formed using different masks 460R, 460G, and 460B for the respective sub-pixels SP. The masks 460R, 460G, and 460B are divided into first regions 461r, 461g, and 461b and second regions 462r, 462g, and 462b, respectively. The area of the first regions 461r, 461g, and 461b can be equal to or greater than the area of the second regions 462r, 462g, and 462b.

As illustrated in FIG. 4, the first regions 461r, 461g, and 461b of the masks 460R, 460G, and 460B have single holes corresponding to the first regions SP_R1, SP_G1, and SP_B1 of the sub-pixels SP, respectively. The second regions 462r, 462g, and 462b of the respective masks 460R, 460G, and 460B have a plurality of slits. FIG. 4 illustrates that the slits in the second regions 462r, 462g, and 462b of the respective masks 460R, 460G, and 460B are formed in a short axis direction of the masks 460R, 460G, and 460B. However, the present disclosure is not limited thereto and other variations are possible. For example, the slits can be formed in a long axis direction of the masks 460R, 460G, and 460B and can have various types or shapes having diffraction method.

With reference to FIG. 3 and FIG. 4, the first mask 460R is used to form the first organic light-emission layer 143R. For example, the first organic light-emission layer 143R can be formed by performing a deposition process while the first mask 460R is disposed in a region corresponding to the red sub-pixel SP_R. The first region 461r of the first mask 460R has a single hole and the second region 462r of the first mask 460R has a plurality of slits. The first region 461r of the first mask 460R corresponds to the first region SP_R1 of the red sub-pixel SP_R, and the second region 462r of the first mask 460R corresponds to the second region SP_R2 of the red sub-pixel SP_R. Due to the single hole and the slits, the thickness t1 of the first organic light-emission layer 143R formed in the first region SP_R1 of the red sub-pixel SP_R can be greater than the thickness t2 of the first organic light-emission layer 143R formed in the second region SP_R2 of the red sub-pixel SP_R.

Further, the second mask 460G is used to form the second organic light-emission layer 143G. For example, the second organic light-emission layer 143G can be formed by performing a deposition process while the second mask 460G is disposed in a region corresponding to the green sub-pixel SP_G. The first region 461g of the second mask 460G has a single hole and the second region 462g of the second mask 460G has a plurality of slits. The first region 461g of the second mask 460G corresponds to the first region SP_G1 of the green sub-pixel SP_G and the second region 462g of the second mask 460G corresponds to second region SP_G2 of the green sub-pixel SP_G. Therefore, the thickness t3 of the second organic light-emission layer 143G formed in the first region SP_G1 of the green sub-pixel SP_G can be greater than the thickness t4 of the second organic light-emission layer 143G formed in the second region SP_G2 of the green sub-pixel SP_G.

Furthermore, the third mask 460B is used to form the third organic light-emission layer 143B. For example, the third organic light-emission layer 143B can be formed by performing a deposition process while the third mask 460B is disposed in a region corresponding to the blue sub-pixel SP_B. The first region 461b of the third mask 460B has a single hole and the second region 462b of the third mask 460B has a plurality of slits. The first region 461b of the third mask 460B corresponds to the first region SP_B1 of the blue sub-pixel SP_B and the second region 462b of the third mask 460B corresponds to the second region SP_B2 of the blue sub-pixel SP_B. Therefore, the thickness t5 of the third organic light-emission layer 143B formed in the first region SP_B1 of the blue sub-pixel SP_B can be greater than the thickness t6 of the third organic light-emission layer 143B formed in the second region SP_B2 of the blue sub-pixel SP_B.

Further, the thickness of the first regions SP_R1, SP_G1, and SP_B1 can be greater than the thickness of the second regions SP_R2, SP_G2, and SP_B2. For example, the thickness t5 can be greater than the thickness t2.

Also, the area of the first regions SP_R1, SP_G1, and SP_B1 can be greater than the area of the second regions SP_R2, SP_G2, and SP_B2 (e.g., in terms of area size). For example, in one case, the first regions SP_R1, SP_G1, and SP_B1 may have the same area as the second regions SP_R2, SP_G2, and SP_B2, and the first regions SP_R1, SP_G1, and SP_B1 and the second regions SP_R2, SP_G2, and SP_B2 can be disposed regularly (or periodically). However, in this case, light reflected and transmitted by the second electrode 150 may cause constructive interference and destructive interference depending on the direction of the light. As a result, diffractive interference or moiré interference may occur. To suppress or prevent the occurrence of moiré interference, the area of the first regions SP_R1, SP_G1, and SP_B1 can be greater than the area of the second regions SP_R2, SP_G2, and SP_B2 according to the embodiments of the present disclosure, e.g., as shown in FIG. 4.

If a micro-cavity is implemented to improve the light efficiency in a related art organic light emitting display apparatus, the light efficiency of a front surface is improved but it can be disadvantageous in the color viewing angle.

Therefore, in the organic light emitting display apparatus 100 according to an embodiment of the present disclosure, a plurality of organic layers has different thicknesses in the first regions SP_R1, SP_G1, and SP_B1 and the second regions SP_R2, SP_G2, and SP_B2 in the respective sub-pixels. Thus, it is possible to obtain both a region where a micro-cavity can be implemented and a region where a color viewing angle can be improved. For example, each sub-pixel can have a double step structure. As a further variation, each or one or more sub-pixels among the plurality of sub-pixels can have three or more such regions as the first and second regions.

Thus, in the organic light emitting display apparatus 100 according to an embodiment of the present disclosure, the shape of a mask corresponds to the plurality of organic layers 140 to be formed. Therefore, it is possible to improve the light efficiency and color viewing angle without additional processes or costs.

Figure 5:
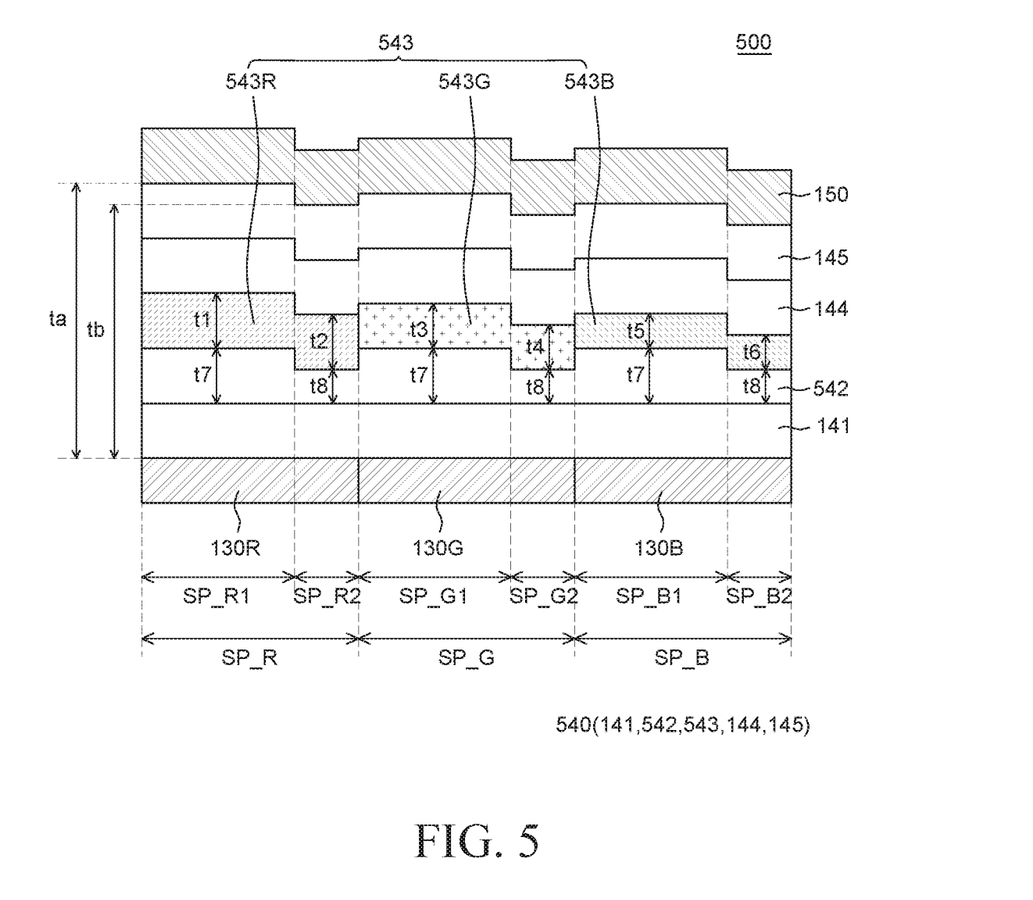
FIG. 5 is a cross-sectional view of an organic light emitting display apparatus according to another embodiment of the present disclosure.
Figure 6:
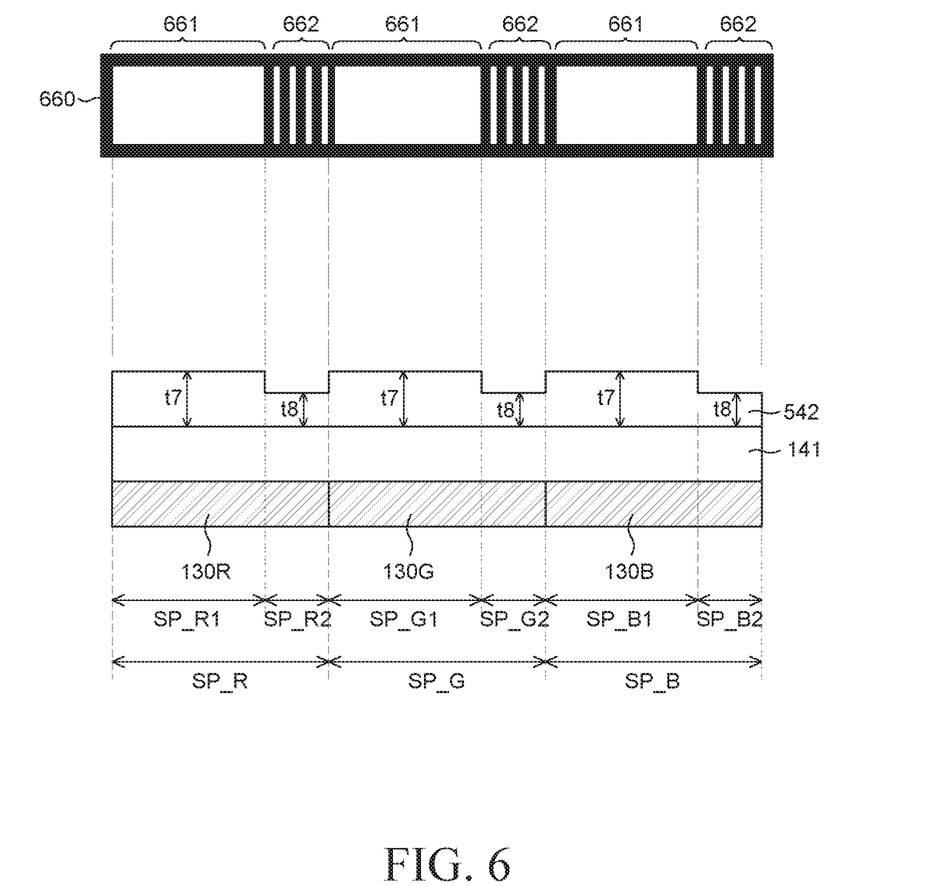
FIG. 6 is an illustration to explain a process for forming a plurality of organic layers of the organic light emitting display apparatus of FIG. 5 according to an embodiment of the present disclosure.

FIG. 5 is a cross-sectional view of an organic light emitting display apparatus according to another embodiment of the present disclosure. FIG. 6 illustrates a process for forming a plurality of organic layers of the organic light emitting display apparatus of FIG. 5 according to an embodiment of the present disclosure. An organic light emitting display apparatus 500 illustrated in FIG. 5 and FIG. 6 is substantially the same as the organic light emitting display apparatus 100 illustrated in FIG. 3 except a plurality of organic layers 540. Therefore, redundant description thereof will be omitted or brief.

With reference to FIG. 5 and FIG. 6, the plurality of organic layers 540 include two regions with different thicknesses in each sub-pixel SP. For example, the plurality of organic layers 540 in each sub-pixel SP can include the first region SP_R1, SP_G1, or SP_B1 and the second region SP_R2, SP_G2, or SP_B2 with different thicknesses.

With reference to FIG. 5, the plurality of organic layers 540 can have different thicknesses (i.e., the total thicknesses) in the first region SP_R1 and the second region SP_R2 of the red sub-pixel SP_R. For example, a thickness ta in the first region SP_R1 can be greater than a thickness tb in the second region SP_R2. As such, a hole transport layer 542 in the red sub-pixel SP_R can have different thicknesses in the first region SP_R1 and the second region SP_R2 such that the thickness ta in the first region SP_R1 is greater than the thickness tb in the second region SP_R2. For example, as illustrated in FIG. 5, a thickness t7 of the hole transport layer 542 in the first region SP_R1 can be greater than a thickness t8 of the hole transport layer 542 in the second region SP_R2. Further, as illustrated in FIG. 5, a thickness t1 of a first organic light-emission layer 543R in the first region SP_R1 can be the same as a thickness t2 of the first organic light-emission layer 543R in the second region SP_R2.

As described above, the plurality of organic layers 540 have different thicknesses in the first region SP_R1 and the second region SP_R2 of the red sub-pixel SP_R. Thus, the first region SP_R1 can be a light efficiency enhancement region and the second region SP_R2 can be a viewing angle enhancement region. For example, the thickness ta of the plurality of organic layers 540 in the first region SP_R1 can be determined or adjusted by the above Equation 1. Thus, the first region SP_R1 of the red sub-pixel SP_R can be called a light efficiency enhancement region where the light efficiency can be improved through constructive interference of light emitted from the first organic light-emission layer 543R.

Further, the thickness tb of the plurality of organic layers 540 in the second region SP_R2 can be smaller than the thickness ta of the plurality of organic layers 540 in the first region SP_R1. Thus, a micro-cavity is not implemented in the second region SP_R2, or even if it is implemented, the micro-cavity has a lower intensity in the second region SP_R2 than in the first region SP_R1. Therefore, the second region SP_R2 can be a viewing angle enhancement region where a decrease in color viewing angle occurring when a stronger micro-cavity is implemented in the first region SP_R1 of the red sub-pixel SP_R can be compensated.

Further, the plurality of organic layers 540 can have different thicknesses (i.e., the total thicknesses) in the first region SP_G1 and the second region SP_G2 of the green sub-pixel SP_G. For example, the thickness in the first region SP_G1 can be greater than the thickness in the second region SP_G2. As such, the hole transport layer 542 in the green sub-pixel SP_G can have different thicknesses in the first region SP_G1 and the second region SP_G2 such that the thickness in the first region SP_G1 is greater than the thickness in the second region SP_G2. For example, as illustrated in FIG. 5, the thickness t7 of the hole transport layer 542 in the first region SP_G1 can be greater than the thickness t8 of the hole transport layer 542 in the second region SP_G2. Further, as illustrated in FIG. 5, a thickness t3 of a second organic light-emission layer 543G in the first region SP_G1 can be the same as a thickness t4 of the second organic light-emission layer 543G in the second region SP_G2.

As described above, the plurality of organic layers 540 can have different thicknesses in the first region SP_G1 and the second region SP_G2 of the green sub-pixel SP_G. Thus, the first region SP_G1 can be a light efficiency enhancement region and the second region SP_G2 can be a viewing angle enhancement region. For example, the thickness of the plurality of organic layers 540 in the first region SP_G1 can be determined or adjusted by the above Equation 1. Thus, the first region SP_G1 of the green sub-pixel SP_G can be a light efficiency enhancement region where the light efficiency can be improved through constructive interference of light emitted from the second organic light-emission layer 543G. Further, to implement a micro-cavity in each sub-pixel SP, the thickness t3 and the thickness t4 of the second organic light-emission layer 543G in the first region SP_G1 and the second region SP_G2, respectively, of the green sub-pixel SP_G can be smaller than the thickness t1 and the thickness t2 of the first organic light-emission layer 543R in the first region SP_R1 and the second region SP_R2, respectively, of the red sub-pixel SP_R.

Furthermore, the thickness of the plurality of organic layers 540 in the second region SP_G2 can be smaller than the thickness of the plurality of organic layers 540 in the first region SP_G1. Thus, a micro-cavity is not implemented in the second region SP_G2. Even if it is implemented, the micro-cavity has a lower intensity in the second region SP_G2 than in the first region SP_G1. Therefore, the second region SP_G2 can be a viewing angle enhancement region where a decrease in color viewing angle occurring when a stronger micro-cavity is implemented in the first region SP_G1 of the green sub-pixel SP_G can be compensated.

Further, the plurality of organic layers 540 can have different thicknesses (i.e., the total thicknesses) in the first region SP_B1 and the second region SP_B2 of the blue sub-pixel SP_B. For example, the thickness in the first region SP_B1 can be greater than the thickness in the second region SP_B2. As such, the hole transport layer 542 in the blue sub-pixel SP_B can have different thicknesses in the first region SP_B1 and the second region SP_B2 such that the thickness in the first region SP_B1 is greater than the thickness in the second region SP_B2. For example, as shown in FIG. 5, the thickness t7 of the hole transport layer 542 in the first region SP_B1 can be greater than the thickness t8 of the hole transport layer 542 in the second region SP_B2. Further, as shown in FIG. 5, a thickness t5 of a third organic light-emission layer 543B in the first region SP_B1 can be the same as a thickness t6 of the third organic light-emission layer 543B in the second region SP_B2.

As described above, the plurality of organic layers 540 has different thicknesses in the first region SP_B1 and the second region SP_B2 of the blue sub-pixel SP_B. Thus, the first region SP_B1 can be a light efficiency enhancement region and the second region SP_B2 can be a viewing angle enhancement region. For example, the thickness of the plurality of organic layers 540 in the first region SP_B1 can be determined or adjusted by the above Equation 1. Thus, the first region SP_B1 of the blue sub-pixel SP_B can be called a light efficiency enhancement region where the light efficiency can be improved through constructive interference of light emitted from the third organic light-emission layer 543B. Further, to implement a micro-cavity in each sub-pixel SP, the thickness t5 and the thickness t6 of the third organic light-emission layer 543B in the first region SP_B1 and the second region SP_B2, respectively, of the blue sub-pixel SP_B can be smaller than the thickness t3 and the thickness t4 of the second organic light-emission layer 543G in the first region SP_G1 and the second region SP_G2, respectively, of the green sub-pixel SP_G.

Furthermore, the thickness of the plurality of organic layers 540 in the second region SP_B2 can be smaller than the thickness of the plurality of organic layers 540 in the first region SP_B1. Thus, a micro-cavity is not implemented in the second region SP_B2, or even if it is implemented, the micro-cavity has a lower intensity in the second region SP_B2 than in the first region SP_B1. Therefore, the second region SP_B2 can be a viewing angle enhancement region where a decrease in color viewing angle occurring when a stronger micro-cavity is implemented in the first region SP_B1 of the blue sub-pixel SP_B can be compensated.

In the example of FIG. 5, the thicknesses t1 and t2 can be the same, the thicknesses t3 and t4 can be the same, and the thicknesses t5 and t6 can be the same. The thickness t1 is greater than the thickness t3 which is greater than the thickness t5. Similarly, the thickness t2 is greater than the thickness t4 which is greater than the thickness t6. Further, the thickness t7 is greater than the thickness t8.

Although the same references are used, the values of the thicknesses ta and ta in FIGS. 3 and 5 may or may not be the same. Similarly, the values of the thicknesses tb and tb in FIGS. 3 and 5 may or may not be the same. Further, the values of the thicknesses t1-t6 in FIG. 3 may or may not be the same as the values of the thicknesses t1-t6 in FIG. 5, respectively.

The process of forming the hole transport layer 542 for forming the plurality of organic layers 540 will be described in more detail with reference to FIG. 6. The hole transport layer 542 can be formed using a single mask 660 in all the sub-pixels SP. The mask 660 can be divided into first regions 661 and second regions 662. The area of the first regions 661 can be equal to or greater than the area of the second regions 662. As illustrated in FIG. 6, the first regions 661 of the mask 660 have single holes corresponding to the first regions SP_R1, SP_G1, and SP_B1 of the respective sub-pixels SP. The second regions 662 of the mask 660 have a plurality of slits.

With reference to FIG. 5 and FIG. 6, the mask 660 is used to form the hole transport layer 542 which is a common layer. For example, the hole transport layer 542 can be formed by performing a deposition process while the mask 660 is disposed in a region corresponding to the red sub-pixel SP_R, the green sub-pixel SP_G, and the blue sub-pixel SP_B. Further, each of the first regions 661 of the mask 660 have a single hole, and each of the second regions 662 of the mask 660 has a plurality of slits. The hole transport layer 542 in the first region SP_R1 of the red sub-pixel SP_R, the first region SP_G1 of the green sub-pixel SP_G, and the first region SP_B1 of the blue sub-pixel SP_B corresponding to the first regions 661 of the mask 660 has the thickness t7. The hole transport layer 542 in the second region SP_R2 of the red sub-pixel SP_R, the second region SP_G2 of the green sub-pixel SP_G, and the second region SP_B2 of the blue sub-pixel SP_B corresponding to the second regions 662 of the mask 660 has the thickness t8. The thickness t7 can be greater than the thickness t8.

FIG. 5 and FIG. 6 illustrate that the hole transport layer 542 among various common layers in the plurality of organic layers 540 have different thicknesses in the first regions SP_R1, SP_G1, and SP_B1 and the second regions SP_R2, SP_G2, and SP_B2 of the respective sub-pixels SP. However, the present disclosure is not limited thereto and other variations are possible. For example, each of the hole injection layer 141, the electron injection layer 145 and the electron transport layer 144 used as a common layer can also have different thicknesses in the first regions SP_R1, SP_G1, and SP_B1 and the second regions SP_R2, SP_G2, and SP_B2 of the respective sub-pixels SP. Further, the hole blocking layer or the electron blocking layer may also have different thicknesses in the first regions SP_R1, SP_G1, and SP_B1 and the second regions SP_R2, SP_G2, and SP_B2 of the respective sub-pixels SP.

Therefore, in the organic light emitting display apparatus 500 according to another embodiment of the present disclosure, a plurality of organic layers 540 has different thicknesses in the first regions SP_R1, SP_G1, and SP_B1 and the second regions SP_R2, SP_G2, and SP_B2 in the respective sub-pixels SP. Thus, it is possible to obtain both a region where a micro-cavity can be implemented and a region where a color viewing angle can be improved.

Thus, in the organic light emitting display apparatus 500 according to this embodiment of the present disclosure, only the shape of a mask is changed to form the plurality of organic layers 540. Therefore, it is possible to improve the light efficiency and color viewing angle without additional processes or costs.

Further, in the organic light emitting display apparatus 500 according to this embodiment of the present disclosure, the single mask 660 is used to deposit the hole transport layer 542 to have different thicknesses. Therefore, it is possible to skip or omit using several times of mask process and thus reduce the processing time.

Furthermore, the hole transport layer 542 of the organic light emitting display apparatus 500 according to this embodiment of the present disclosure is rather inexpensive. Therefore, if the hole transport layer 542 is used for a deposition process, processing costs can be reduced, and, thus, it can be advantageous in terms of process change.

An organic light emitting display apparatus according to an embodiment of the present disclosure will be described below.

An organic light emitting display apparatus according to an embodiment of the present disclosure includes a first electrode on a substrate, a plurality of organic layers on the first electrode and including a first region and a second region, and a second electrode on the plurality of organic layers. A thickness of the plurality of organic layers in the first region is different from a thickness of the plurality of organic layers in the second region.

According to some embodiments of the present disclosure, the plurality of organic layers may include an organic light-emission layer. The thickness of the plurality of organic layers in the first region may be determined by the following Equation 1:

$$ta = m\lambda/2n \quad \text{[Equation 1]}$$

where ta=thickness of the plurality of organic layers in the first region, m=positive integer, n=refractive index of the plurality of organic layers, λ=wavelength of light emitted from the organic light-emission layer. The thickness of the plurality of organic layers in the second region may be smaller than the thickness of the plurality of organic layers in the first region.

According to some embodiments of the present disclosure, the plurality of organic layers may include an organic light-emission layer, and a thickness of the organic light-emission layer in the first region can be larger than a thickness of the organic light-emission layer in the second region.

According to some embodiments of the present disclosure, the plurality of organic layers can include at least one of a hole injection layer, a hole transport layer, an electron injection layer, an electron transport layer, a hole blocking layer, and an electron blocking layer, and a thickness of at least one of the hole injection layer, the hole transport layer, the electron injection layer, the electron transport layer, the hole blocking layer, and the electron blocking layer in the first region may be greater than a thickness thereof in the second region.

According to some embodiments of the present disclosure, the plurality of organic layers can include the hole transport layer, and a thickness of the hole transport layer in the first region may be larger than a thickness thereof in the second region.

According to some embodiments of the present disclosure, an area size of the first region may be greater than an area size of the second region.

According to some embodiments of the present disclosure, the organic light emitting display apparatus may further include a reflective layer under the first electrode and having a metal material. The first electrode may be formed of a transparent conductive material.

According to some embodiments of the present disclosure, the first electrode, the plurality of organic layers, and the second electrode may be provided for each of a plurality of sub-pixels.

According to some embodiments of the present disclosure, the plurality of sub-pixels may include a first-color sub-pixel, a second-color sub-pixel adjacent to the first-color sub-pixel, and a third-color sub-pixel adjacent to the second-color sub-pixel, and a thickness of the first region in the first-color sub-pixel may be greater than a thickness of the first region in the second-color sub-pixel, and the thickness of the first region in the second-color sub-pixel may be greater than a thickness of the first region in the third-color sub-pixel.

According to some embodiments of the present disclosure, a thickness of the second region in the first-color sub-pixel may be greater than a thickness of the second region in the second-color sub-pixel, and the thickness of the second region in the second-color sub-pixel may be greater than a thickness of the second region in the third-color sub-pixel.

According to some embodiments of the present disclosure, the plurality of organic layers may include an organic light-emission layer, and a hole transport layer disposed on the organic light-emission layer. A thickness of the hole transport layer in the first region may be greater than a thickness of the hole transport layer in the second region, According to some embodiments of the present disclosure, a thickness of the organic light-emission layer in the first region may be the same as a thickness of the organic light-emission layer in the second region.

An organic light emitting display apparatus according to an embodiment of the present disclosure includes a substrate including a plurality of sub-pixels, a plurality of first electrodes in the plurality of sub-pixels, respectively, a plurality of organic layers on each of the plurality of first electrodes, and a second electrode on the plurality of organic layers in each of the plurality of sub-pixels, wherein each of the plurality of sub-pixels includes a light efficiency enhancement region and a viewing angle enhancement region in which the plurality of organic layers have different thicknesses.

According to some embodiments of the present disclosure, the thickness of the plurality of organic layers in the light efficiency enhancement region can be configured to have a micro-cavity in each of the plurality of sub-pixels, and the thickness of the plurality of organic layers in the viewing angle enhancement region may be smaller than the thickness of the plurality of organic layers in the light efficiency enhancement region.

According to some embodiments of the present disclosure, the plurality of organic layers may include a plurality of organic light-emission layers spaced apart from each other in the plurality of sub-pixels, respectively, and at least one common layer commonly in the plurality of sub-pixels, and the plurality of organic light-emission layers may have different thicknesses in the plurality of sub-pixels and may have different thicknesses in the light efficiency enhancement region and the viewing angle enhancement region of each of the plurality of sub-pixels.

According to some embodiments of the present disclosure, the plurality of organic layers may include a plurality of organic light-emission layers spaced apart from each other in the plurality of sub-pixels, respectively, and at least one common layer commonly in the plurality of sub-pixels. The at least one common layer can have different thicknesses in the light efficiency enhancement region and the viewing angle enhancement region of each of the plurality of sub-pixels. The plurality of organic light-emission layers may have the same thickness in the light efficiency enhancement regions and the viewing angle enhancement regions of the plurality of sub-pixels.

According to some embodiments of the present disclosure, an area size of the light efficiency enhancement region may be greater than an area size of the viewing angle enhancement region.

An organic light emitting display apparatus according to an embodiment of the present disclosure includes a plurality of sub-pixels on a substrate, including a red sub-pixel, a green sub-pixel, and a blue sub-pixel, wherein each of the red, green and blue sub-pixels includes a first electrode on the substrate, a plurality of organic layers on each of the plurality of first electrodes and including a first region and a second region, a second electrode on the plurality of organic layers, wherein for each of the red, green and blue sub-pixels, a thickness of the plurality of organic layers in the first region is greater than a thickness of the plurality of organic layers in the second region.

According to some embodiments of the present disclosure, the thickness of the plurality of organic layers in the first region of one of the red, green and blue sub-pixels may be greater than the thickness of the plurality of organic layers in the first region of another of the red, green and blue sub-pixels.

According to some embodiments of the present disclosure, for each of the red, green and blue sub-pixels, a width of the first region may be greater than a width of the second region.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display apparatus, comprising:
    a first electrode on a substrate;
    a bank on portions of the first electrode and defining an opening;
    a plurality of organic layers on the first electrode and including a first region and a second region associated with a sub-pixel, the first and second regions being disposed in the opening defined by the bank; and
    a second electrode on the plurality of organic layers,
    wherein a thickness of the plurality of organic layers in the first region is different from a thickness of the plurality of organic layers in the second region,
    wherein the plurality of organic layers include an organic light-emission layer,
    wherein a thickness of the organic light-emission layer in the first region is larger than a thickness of the organic light-emission layer in the second region, and
    wherein a bottom surface of the organic light-emission layer in the first region is substantially coplanar with a bottom surface of the organic light-emission layer in the second region.

2. The organic light emitting display apparatus of claim 1, wherein the thickness of the plurality of organic layers in the first region is determined by the following Equation 1:

$$ta = m\lambda/2n \qquad \text{[Equation 1]}$$

where ta=Thickness of the plurality of organic layers in the first region, m=positive integer, n=refractive index of the plurality of organic layers, and $\lambda$=wavelength of light emitted from the organic light-emission layer, and the thickness of the plurality of organic layers in the second region is smaller than the thickness of the plurality of organic layers in the first region.

3. The organic light emitting display apparatus of claim 1, wherein the plurality of organic layers further include at least one of a hole injection layer, a hole transport layer, an electron injection layer, an electron transport layer, a hole blocking layer, and an electron blocking layer, and a thickness of at least one of the hole injection layer, the hole transport layer, the electron injection layer, the electron transport layer, the hole blocking layer, and the electron blocking layer in the first region is greater than a thickness of the at least one of the hole injection layer, the hole transport layer, the electron injection layer, the electron transport layer, the hole blocking layer, and the electron blocking layer in the second region.

4. The organic light emitting display apparatus of claim 1, wherein the plurality of organic layers further include a hole transport layer, and a thickness of the hole transport layer in the first region is the same as a thickness of the hole transport layer in the second region.

5. The organic light emitting display apparatus of claim 1, wherein an area size of the first region is greater than an area size of the second region.

6. The organic light emitting display apparatus of claim 1, further comprising:

a reflective layer under the first electrode and having a metal material, wherein the first electrode is formed of a transparent conductive material.

7. The organic light emitting display apparatus of claim 1, wherein the first electrode, the plurality of organic layers, and the second electrode are provided for each of a plurality of sub-pixels, wherein the plurality of sub-pixels include a first-color sub-pixel, a second-color sub-pixel adjacent to the first-color sub-pixel, and a third-color sub-pixel adjacent to the second-color sub-pixel, and wherein a thickness of the first region in the first-color sub-pixel is greater than a thickness of the first region in the second-color sub-pixel, and the thickness of the first region in the second-color sub-pixel is greater than a thickness of the first region in the third-color sub-pixel.

8. The organic light emitting display apparatus of claim 7, wherein a thickness of the second region in the first-color sub-pixel is greater than a thickness of the second region in the second-color sub-pixel, and the thickness of the second region in the second-color sub-pixel is greater than a thickness of the second region in the third-color sub-pixel.

9. The organic light emitting display apparatus of claim 7, wherein for each of the first-color, second-color and third-color sub-pixels, a bottom surface of the organic light-emission layer in the first region is substantially coplanar with a bottom surface of the organic light-emission layer in the second region.

10. The organic light emitting display apparatus of claim 1, wherein the plurality of organic layers further include a hole transport layer disposed on the organic light-emission layer, and wherein a thickness of the hole transport layer in the first region is greater than a thickness of the hole transport layer in the second region.

11. An organic light emitting display apparatus comprising:

a first electrode on a substrate;
a plurality of organic layers on the first electrode and including a first region and a second region associated with a sub-pixel; and
a second electrode on the plurality of organic layers, wherein a thickness of the plurality of organic layers in the first region is different from a thickness of the plurality of organic layers in the second region, wherein the plurality of organic layers include an organic light-emission layer, and a thickness of the organic light-emission layer in the first region is the same as a thickness of the organic light-emission layer in the second region, wherein the plurality of organic layers further include a hole transport layer disposed on the organic light-emission layer, and wherein a thickness of the hole transport layer in the first region is greater than a thickness of the hole transport layer in the second region.

12. An organic light emitting display apparatus, comprising:

a substrate including a plurality of sub-pixels;
a plurality of first electrodes in the plurality of sub-pixels, respectively;
a plurality of organic layers on each of the plurality of first electrodes; and
a second electrode on the plurality of organic layers in each of the plurality of sub-pixels, wherein each of the plurality of sub-pixels includes a light efficiency enhancement region and a viewing angle enhancement region, wherein a thickness of the plurality of organic layers in the light efficiency enhancement region is greater than a thickness of the plurality of organic layers in the viewing angle enhancement region, and wherein a top surface of the plurality of organic layers in the light efficiency enhancement region is positioned higher than a top surface of the plurality of organic layers in the viewing angle enhancement region.

13. The organic light emitting display apparatus of claim 12, wherein the thickness of the plurality of organic layers in the light efficiency enhancement region is configured to have a micro-cavity in each of the plurality of sub-pixels, and the thickness of the plurality of organic layers in the viewing angle enhancement region is smaller than the thickness of the plurality of organic layers in the light efficiency enhancement region.

14. The organic light emitting display apparatus of claim 12, wherein the plurality of organic layers include:

a plurality of organic light-emission layers spaced apart from each other in the plurality of sub-pixels, respectively; and
at least one common layer commonly in the plurality of sub-pixels, and
the plurality of organic light-emission layers have different thicknesses in the plurality of sub-pixels and have different thicknesses in the light efficiency enhancement region and the viewing angle enhancement region of each of the plurality of sub-pixels.

15. An organic light emitting display apparatus, comprising:

a substrate including a plurality of sub-pixels;
a plurality of first electrodes in the plurality of sub-pixels, respectively;
a plurality of organic layers on each of the plurality of first electrodes; and
a second electrode on the plurality of organic layers in each of the plurality of sub-pixels, wherein each of the plurality of sub-pixels includes a light efficiency enhancement region and a viewing angle enhancement region in which the plurality of organic layers have different thicknesses, wherein the plurality of organic layers include:

a plurality of organic light-emission layers spaced apart from each other in the plurality of sub-pixels, respectively; and at least one common layer commonly in the plurality of sub-pixels, wherein the at least one common layer has different thicknesses in the light efficiency enhancement region and the viewing angle enhancement region of each of the plurality of sub-pixels, and wherein the plurality of organic light-emission layers have the same thickness in the light efficiency enhancement regions and the viewing angle enhancement regions of the plurality of sub-pixels.

16. The organic light emitting display apparatus of claim 15, wherein an area size of the light efficiency enhancement region is greater than an area size of the viewing angle enhancement region.

17. An organic light emitting display apparatus, comprising:

a plurality of sub-pixels on a substrate, and including a first-color sub-pixel, a second-color sub-pixel, and a third-color sub-pixel, wherein each of the first-color, second-color and third-color sub-pixels includes:

a first electrode on the substrate;

a plurality of organic layers on the first electrode and including a first region and a second region; and a second electrode on the plurality of organic layers, wherein for each of the first-color, second-color and third-color sub-pixels, a thickness of the plurality of organic layers in the first region is greater than a thickness of the plurality of organic layers in the second region, and a top surface of the plurality of organic layers in the first region is positioned higher than a top surface of the plurality of organic layers in the second region.

18. The organic light emitting display apparatus of claim 17, wherein the thickness of the plurality of organic layers in the first region of one of the first-color, second-color and third-color sub-pixels is greater than the thickness of the plurality of organic layers in the first region of another of the first-color, second-color and third-color sub-pixels.

19. The organic light emitting display apparatus of claim 17, wherein for each of the first-color, second-color and third-color sub-pixels, a width of the first region is greater than a width of the second region.

* * * * *